(12) United States Patent
Nowak et al.

(10) Patent No.: US 6,444,035 B1
(45) Date of Patent: Sep. 3, 2002

(54) CONVEYORIZED VACUUM INJECTION SYSTEM

(75) Inventors: Thomas Nowak, N. Hampton, NH (US); Jules Gordon, Methuen, MA (US); Kevin Avery, Salisbury, MA (US); David Thurlow, Newbury, MA (US)

(73) Assignee: Speedline Technologies, Inc., Haverhill, MA (US)

( * ) Notice: Subject to any disclaimer, the term of this patent is extended or adjusted under 35 U.S.C. 154(b) by 0 days.

(21) Appl. No.: 09/493,873

(22) Filed: Jan. 28, 2000

(51) Int. Cl.[7] .......................... B29C 31/00; B05C 11/00
(52) U.S. Cl. ...................... 118/684; 425/110; 264/102; 264/272.17
(58) Field of Search .................. 118/668, 678, 118/679, 684; 425/110; 264/102, 272.17; 427/96

(56) References Cited

U.S. PATENT DOCUMENTS

| | | | |
|---|---|---|---|
| 3,918,401 A | * 11/1975 | Blakeslee | 118/630 |
| 3,946,907 A | 3/1976 | Berve | 222/152 |
| 4,593,835 A | 6/1986 | Kikkawa et al. | 222/131 |
| 5,203,076 A | 4/1993 | Banerji et al. | 29/840 |
| 5,480,487 A | 1/1996 | Figini et al. | 118/610 |
| 5,762,684 A | * 6/1998 | Hayashi et al. | 95/24 |
| 5,817,545 A | 10/1998 | Wang et al. | 438/127 |
| 5,819,983 A | 10/1998 | White et al. | 222/1 |
| 5,866,442 A | 2/1999 | Brand | 438/108 |
| 5,906,682 A | * 5/1999 | Bouras et al. | 118/712 |
| 5,998,242 A | 12/1999 | Kirkpatrick et al. | 438/127 |
| 6,000,924 A | 12/1999 | Wang et al. | 425/125 |
| 6,255,142 B1 | * 7/2001 | Babiarz et al. | 438/126 |
| 6,284,173 B1 | * 9/2001 | Austin et al. | 264/102 |

FOREIGN PATENT DOCUMENTS

WO  WO 99/56316  4/1999

OTHER PUBLICATIONS

V. Solberg, "Assembly Process Requirements For ChipScale and Chip–Size μBGA", Tessera, Inc.
International Search Report mailed Jul. 20, 2001.

* cited by examiner

Primary Examiner—Richard Crispino
Assistant Examiner—Yewebdar T Tadesse
(74) Attorney, Agent, or Firm—Mintz, Levin, Cohn, Ferris, Glovsky and Popeo, P.C.

(57) ABSTRACT

The present invention provides a method and apparatus for dispensing materials onto a substrate. In one embodiment, a dispensing system includes a controller, a vacuum source in electrical communication with the controller, the vacuum source applying a vacuum to at least a portion of the substrate in response to an instruction from the controller, an injector in electrical communication with the controller, the injector comprising a valve in communication with a pressure source and a material port in communication with a material source, the valve permitting material from the material source to be dispensed onto a substrate in accordance with an instruction from the controller. In one embodiment, the dispensing system also includes a trap in communication with the vacuum source, where the trap substantially prevents excessive material dispensed by the injector from contacting the vacuum source.

14 Claims, 10 Drawing Sheets

US 6,444,035 B1

CONVEYORIZED VACUUM INJECTION SYSTEM

RELATED APPLICATION

This application is related to U.S. Utility Application Ser. No. 09/168,536, filed Oct. 10, 1998, which is incorporated by reference herein.

FIELD OF THE INVENTION

The present invention relates to an apparatus, process, and system for encapsulating electronic parts, and more specifically to an apparatus and process which uses changes in air pressure to force material under and around an electronic integrated circuit chip.

BACKGROUND OF THE INVENTION

The need for denser, larger and more durable chip assemblies has broadened the use of Direct Chip Attach (DCA) technology to include flip chip integrated circuits. A typical flip chip integrated circuit utilizes a solder ball grid array to provide electrical connections between a die of the flip chip and a substrate. During manufacturing of a typical flip chip, after the flip chip is assembled on a substrate, a liquid dispensing system is used to apply an underfill encapsulant material between the die and the substrate. The flip chip underfill material is used to reduce mechanical and thermal stress on the electrical connections and to protect the electrical connections against atmospheric conditions. The underfill material provides stability and rigidity to the assembled flip chip and may also be used as a heat conductor to improve thermal performance of the flip chip.

In typical prior art flip chip underfilling processes, a dispenser system is used to dispense underfill material around the sides of the flip chip and the underfill material spreads under the flip chip and around the solder balls of the grid array via capillary action or "wicking". During the assembly process, the substrate is typically heated prior to, during, and after dispensing of the underfill material to a temperature ranging from ambient conditions to approximately 120° C. The heating of the substrate increases the capillary action causing the underfill material to flow further under the die of the flip chip. A final fillet of underfill material is applied around the sides of the flip chip after the wicking action has occurred. A drawback associated with such underfilling processes is that the underfill material may not completely fill all voids between a die and a substrate in a flip chip. For example, the underfill material can fail to fill spaces between the contacts of a die.

To overcome the problem of voids or air gaps, one prior art dispensing system developed by Tessera of San Jose, Calif. utilizes a vacuum approach to completely underfill flip chips. In this prior art system, the dispensing system, including one or more flip chips that are to receive underfill material, is enclosed within an air tight chamber, and prior to the dispensing of underfill material, a vacuum pump is used to purge all air from the chamber to create a vacuum. The underfill material is then dispensed around all sides of the flip chips, and the chamber is returned to ambient pressure. When the chamber is returned to ambient air pressure, the underfill material is forced under the flip chips by the difference in air pressure outside the flip chips and under the flip chips.

While the above described prior art system is effective in preventing voids in underfill material in flip chips, the system is relatively large and the time required to purge air from the air tight chamber is rather long. Further, because the airtight chamber is so large, it is difficult to effectively purge air from the chamber. In addition, the air tight chamber of the prior art accommodates only manual loading of the flip chips into the chamber, preventing the dispensing system contained within the chamber from being effectively used in an automated assembly line. Moreover, the large size of the airtight chamber often precludes it from easy integration into automated manufacturing processes.

SUMMARY OF THE INVENTION

The present invention overcomes disadvantages of the prior art by providing a system, apparatus and process for encapsulating flip chips using dispensing systems having fixtures operating cooperatively with injection and vacuum valves to overcome drawbacks of the prior art systems.

In one embodiment, a dispensing system includes a controller, a vacuum source in electrical communication with the controller, the vacuum source applying a vacuum to at least a portion of the substrate in response to an instruction from the controller, and an injector in electrical communication with the controller and having a vacuum port in communication with the vacuum source, the injector comprising a valve in communication with a pressure source and a material source, the valve permitting material to be dispensed from the material source onto a substrate in accordance with an instruction from the controller.

BRIEF DESCRIPTION OF THE DRAWINGS

For a better understanding of the present invention, reference is made to the drawings, which are incorporated herein by reference, and in which.

DETAILED DESCRIPTION

For purposes of illustration, embodiments of the present invention will now be described with reference to a dispensing system used to dispense underfill material beneath and around electronic components such as flip chip integrated circuits. One skilled in the art will appreciate, however, that embodiments of the present invention are not limited to dispensing underfill materials for flip chip integrated circuits, but may be used in other applications.

As used in this description, the term "vacuum" does not necessarily refer only to producing a space entirely devoid of matter, but rather is intended also to encompass producing a space from which matter, especially air, has been partially or substantially removed.

One technique for encapsulating electronic components is described in an application filed under the Patent Cooperation Treaty (PCT) having Publication Number WO 99/53616, the contents of which are incorporated herein by reference. In the described method, electronic components are disposed in an assembly having top and bottom sealing layers defining an enclosed space containing the components. The assembly is engaged in a test fixture, and the enclosed space is evacuated by applying a vacuum to a hole in one of the sealing layers. Then, the vacuum is removed from the hole, a needle is advanced into that hole, and a liquid encapsulant is injected through the needle into the enclosed space around the electronic components. The encapsulant flows into the enclosed space, where it is free to flow around the components.

One disadvantage of this method, however, is that the vacuum and encapsulant flowing through the needle must be precisely controlled to ensure proper flow. Another disadvantage is that the injected liquid encapsulant may not flow sufficiently around and under all of the components to properly encapsulate each component. Still another disadvantage is that excess encapsulant can flow back out of the hole and contaminate the assembly, text fixture, vacuum, or other elements. Yet another disadvantage is that waiting for the liquid encapsulant to flow around each component increases the process time for encapsulating the components.

Figure 1:
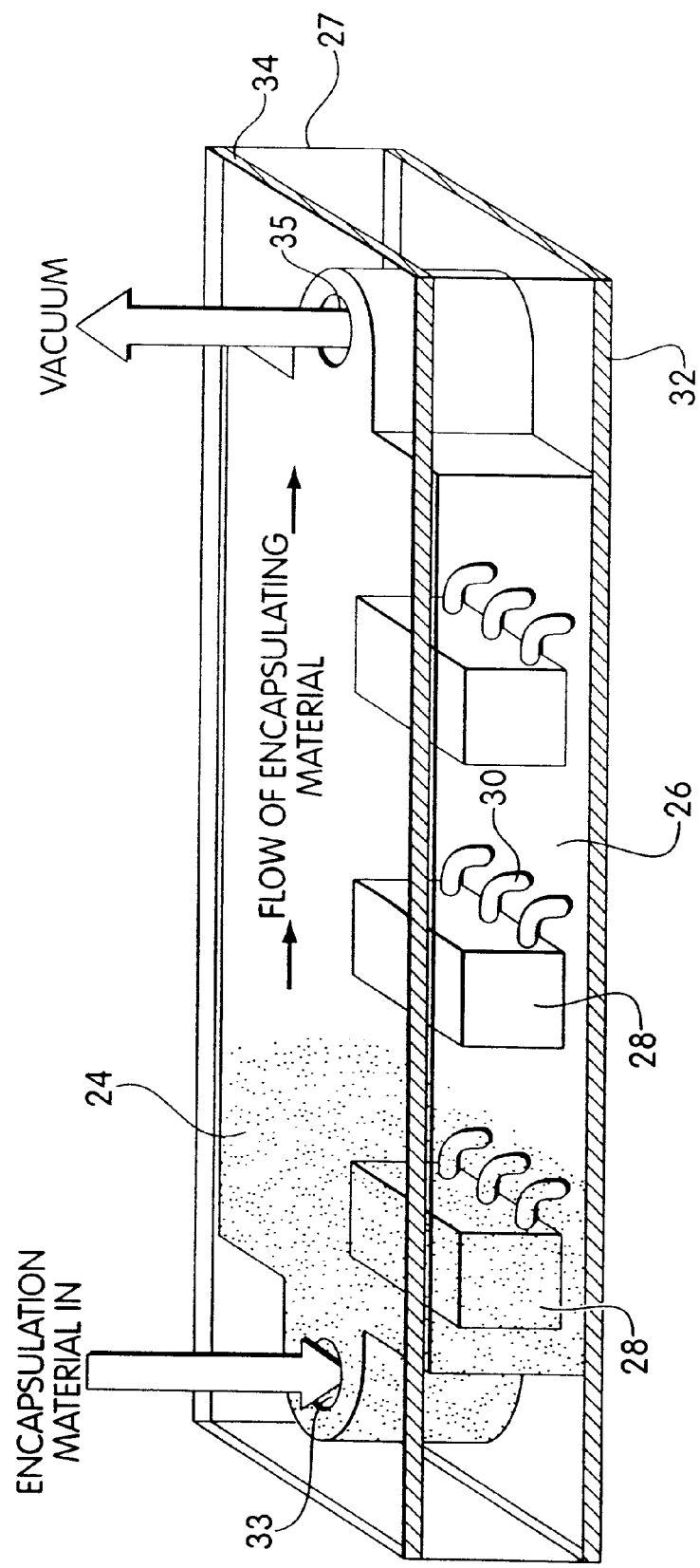
FIG. 1 illustrates a workpiece usable in accordance with the invention and shows the flow of encapsulating material at the workpiece in accordance with an embodiment of the invention.

FIG. 1 illustrates a workpiece 27, such as a substrate, having components 28 that may receive encapsulant material 24 using processes and apparatuses of the present invention. In FIG. 1, material 24 is shown flowing through the workpiece during an encapsulation process. The workpiece 27 includes a hollow area 26, in which several components to be encapsulated, namely electronic components 28 having leads 30, are disposed. The hollow area 26 of workpiece 27 in FIG. 1 can be formed between a top coverlay tape 34 disposed on the "die side" (i.e., the top of the components 28) and a bottom coverlay tape 32 disposed on the "contact side" (i.e., the bottom of the components 28). An injection hole 33 is formed in the top coverlay tape 34 at a first side of the hollow area 26 to permit encapsulation material 24 to be injected. Similarly, a vacuum hole 35 is formed in the top coverlay tape 34 to permit a vacuum to be drawn on the hollow area 26. Having the injection hole 33 and vacuum hole 35 as separate holes, disposed on opposite sides of the hollow area 26, is advantageous because the vacuum being pulled at the vacuum hole 35 helps to rapidly draw the material 24 through the hollow area 26 and around the components 28 and also helps to ensure that the material 24 flows around, over, and under all of the components 28.

It should be understood that illustration of three electronic components 28 is not intended to be limiting; any number of components can be disposed in the hollow area 26. Further, the articles disposed in the hollow area 26 need not be electronic or other types of components, but rather can include any articles to be encapsulated. As FIG. 1 illustrates, the material 24 not only flows around the components 24 but also flows around the leads 30 of the components 28, thereby helping to prevent voids in the encapsulant.

Figure 2:
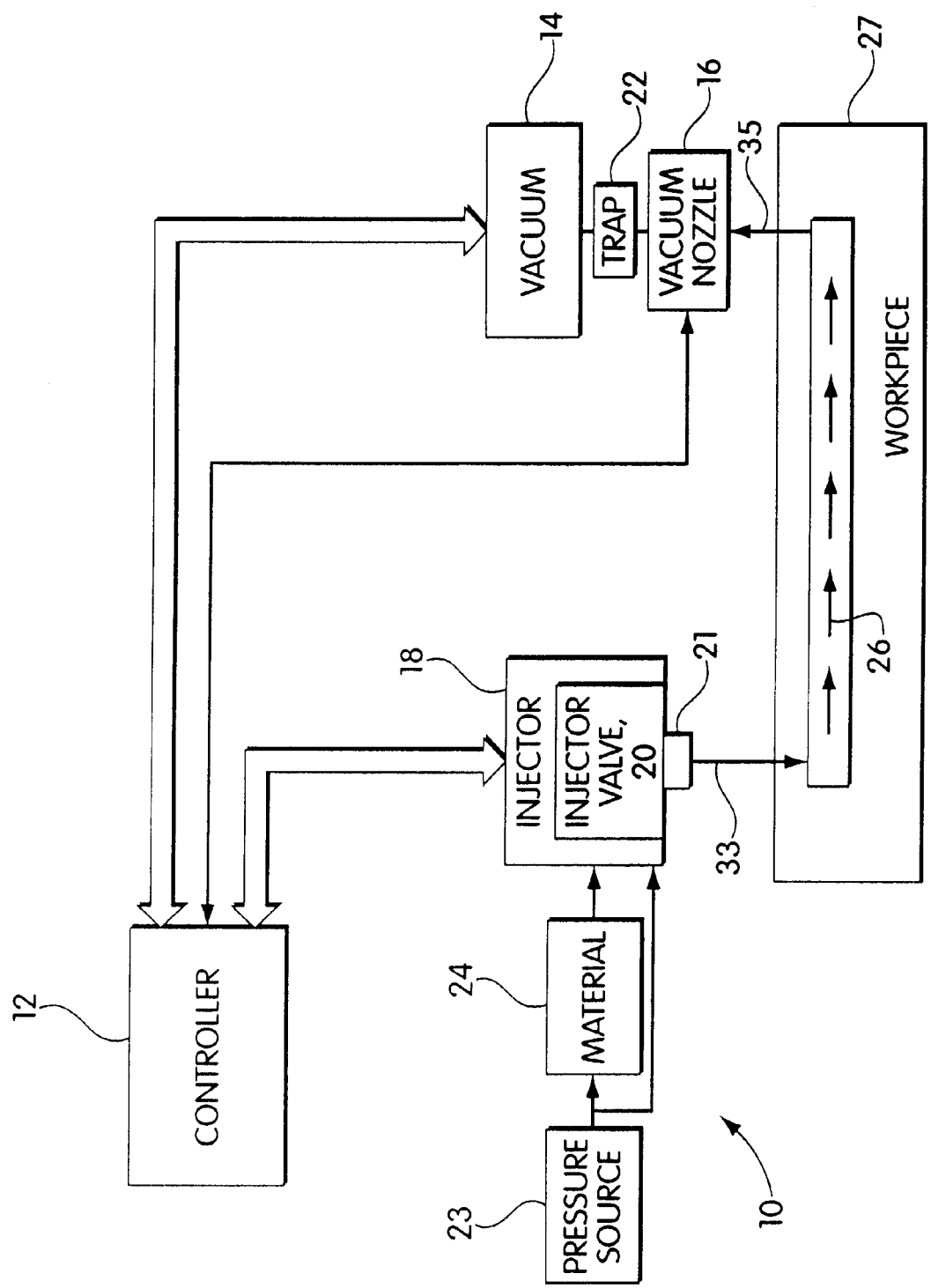
FIG. 2 is a block diagram illustration of a vacuum injection system, in accordance with one embodiment of the invention.

FIG. 2 shows a block diagram of one embodiment of a vacuum injection system 10 in accordance with the invention, for dispensing media such as underfill material along the sides, underneath, and between components such as flip chip integrated circuits (not shown) disposed on a workpiece 27 or carrier (not shown). The vacuum injection system 10 includes a controller 12, a vacuum source 14 having a nozzle 16, an injector 18 having an injector valve 20, and a trap 22. The injector 18 injects underfill material 24 receiving force from a pressure source 23. During operation of the vacuum injection system 10, the vacuum nozzle 16 connects to the vacuum hole 35 on one side of the hollow area 26 in the workpiece 37 so that the vacuum source 14 can draw a vacuum on the hollow area 26, while the injector valve 20 permits the injector 18 to inject encapsulating material 24 into the injection hole 33. The vacuum applied by vacuum source 14 draws the encapsulating material 24 from the injection hole 33 towards the vacuum source 14, so that the encapsulating material 24 can encapsulate and underfill all of the components in the hollow area 26 while substantially eliminating voids. This is explained more fully below.

The controller 12 can be any system or processor capable of controlling the vacuum injection processes described herein. For example, the controller 12 can be a programmable logic controller (PLC), a general purpose digital computer running one or more programs relating to control of the vacuum injection processes, or a proprietary processor system board. In one embodiment, the controller 12 is a proprietary processor system board having a plurality of input/output (I/O) control points. In another embodiment, the controller 12 can further include or access one or more daughter boards that can provide other circuit functions, such as analog I/O, high power switching, communications to peripherals, video display, and the like. In still another embodiment, the controller 12 is a computer having a PENTIUM microprocessor (manufactured by Intel Corporation of Santa Clara, Calif.) and storing and running a plurality of process instructions and associated software relating to control of the system 10. The controller 12 can be a stand-alone computer, such as a personal computer, or can be networked to one or more other computers.

In one embodiment, the controller 12 stores a plurality of process "recipes" relating to encapsulating components and/or assemblies on the workpiece 27. For example, a process recipe may include all instructions and control programs necessary to encapsulate a predetermined quantity of a predetermined component disposed on a fixture having a predetermined size. Because the controller 12 is in communication with the injector 18 and the vacuum source 14, it can program either or both of these elements to operate in accordance with a particular process for a particular component or material. In another embodiment, the controller 12 can monitor the vacuum level at the vacuum source 14 and adjust it as necessary. In another example, the controller 12 can control the injector 18 to inject material 24 for a predetermined time by enabling and disabling the injector valve 20.

For example, the controller 12 can instruct the vacuum source 14 to apply a predetermined vacuum level (e.g., 5 inches of mercury (in./Hg)) to the workpiece 27 and to maintain this vacuum level for a predetermined time. While the vacuum level is maintained, the controller 12 directs the injector 18 to configure the injector valve 20 to inject a specific quantity (e.g., 1 cubic centimeter (cc)) of a material 24, for example silicone encapsulant, from a particular source of material 24, such as a particular cartridge or syringe of material 24.

Vacuum source 14 can be a pump, such as an oil-free vacuum pump, capable of reaching a predetermined vacuum level within a predetermined time. In one embodiment, the vacuum pump is a diaphragm-style pump manufactured by Varian Associates of Lexington Mass. For example, in one embodiment, the vacuum source 14 can reach a maximum vacuum of 28 in./Hg within 5 seconds. The vacuum level and time during which vacuum is applied can be set; for example, they can be programmed by controller 12 or set manually using one or more switches. Depending on how it is programmed, the vacuum source 14 can apply a vacuum at its nozzle 16 to the hollow area 26 before, during, and/or after injection of the material 24. This permits the vacuum source 24 to "draw" injected material 24 through the hollow area 26 after the material 24 has been injected, thereby encapsulating components therein without voids. In addition, by continuing to apply a vacuum to the hollow area 26 after injection of the material 24, the material 24 can be drawn through the hollow area 26 faster than the material 24 flows without the vacuum being applied.

The trap 22 is disposed between the vacuum source 14 and the vacuum nozzle 16 to trap possible excess material 24 injected into the hollow area 26 of the workpiece 27, to prevent contamination of the vacuum source 14. For example, the trap 22 can be a jar having a removable reservoir, so that material 24 in the trap 22 can be removed easily. In one embodiment, the trap 22 includes a disposable and easily removed reservoir. Many different types and styles of reservoir-type devices are usable in accordance with this aspect of the invention, as those skilled in the art will recognize.

In one embodiment, the trap 22 can include a level sensor (not shown) capable of detecting the level of material 24 in the trap 22. Those skilled in the art will recognize that many different types of sensing devices are usable to detect the level of material 24 in the trap 22. The level sensor can stop the injection process if the material 24 in the trap 22 reaches a predetermined level, such as if the trap 22 becomes three quarters full. Alternately, the controller 12 can monitor the level of material 24 and stop the injection process if the material 24 in the trap 22 reaches a predetermined level. The vacuum source 14 is coupled to a vacuum nozzle 16 adapted to fit tightly to the vacuum hole 35 on the workpiece 27.

The injector 18 can accommodate workpieces 27 and/or hollow areas having differing sizes. The injector 18 can include an injection port 21 that fits tightly to (or within) the injection hole 33 on the workpiece 27 to inject material 24 into the hollow area 26 after the vacuum source 14 has evacuated air from the hollow area 26. In another embodiment, the injector 18 can begin injecting material 24 into the hollow area 26 while the vacuum source 14 is evacuating air from the hollow area 26. A pressure source 23, such as a cartridge assembly manufactured by EFD Inc. of Providence, R.I., uses pressure to force the material 24 out of the injection port 21 and into the hollow area 26. In one example, the material 24 is stored in a cartridge or syringe and pressure is applied to the cartridge to force material 24 from the cartridge out through the injection port 21. In one embodiment, the pressure source 23 can be an air-driven or mechanical ram.

The injector 18 provides a positive shut-off, which can help to prevent material 24 from dripping out of the injection port 21 after pressure on the material 24 is released or after injection of a predetermined quantity of material 24 is complete. In one embodiment, the positive shut-off is provided using a valve 20 that is precisely controlled by controller 12. This aspect is described more fully below. In another embodiment, the injector 18 can include one or more ports (not shown) accepting syringes and/or cartridges containing material 24 to be injected. In still another embodiment, the injector 18 can be supplied with material 24 from a bulk feeding device such as a ram pail pump, such as the DynaMite 190 manufactured by Graco, Inc. of Minneapolis Minn. The controller 12 can communicate with the injector valve 20 to control operation of the injector 18, when injection occurs, to control the level of pressure applied at the pressure source 23, to release the pressure on the pressure source 23, to select the source of material 24, and to control the flow of material 24 into the injector 18.

The material 24 can be any material used for encapsulating articles. For example, some materials, such as silicone chip encapsulant material, can be used as a compliant layer to decouple the mismatched thermal expansion rates of silicon and common printed circuit board (PCB) laminates (to which a silicon electronic component being encapsulated may later be attached). Silicone chip encapsulant material can also increase the solvent resistance of the article being encapsulated.

The workpiece 27, integrated circuits or other substrates that are to receive dispensing material in the system 10 can be transported as individual units on conveyors, multiple units in a common carrier, or using a continuous tape feeder system. The workpiece 27 can, in one embodiment, include such individual units, multiple units on a common carrier, or a continuous tape feeder system. The system 10 may include a conveyor (not shown in FIG. 1, but illustrated in FIGS. 4–8) for loading and unloading integrated circuits or multiple unit common carriers into the dispensing system. Alternatively, the system 10 may be configured as known in the art for receiving a continuous tape having integrated circuits that are to receive encapsulant material bonded to the top surface of the tape.

Figure 3:
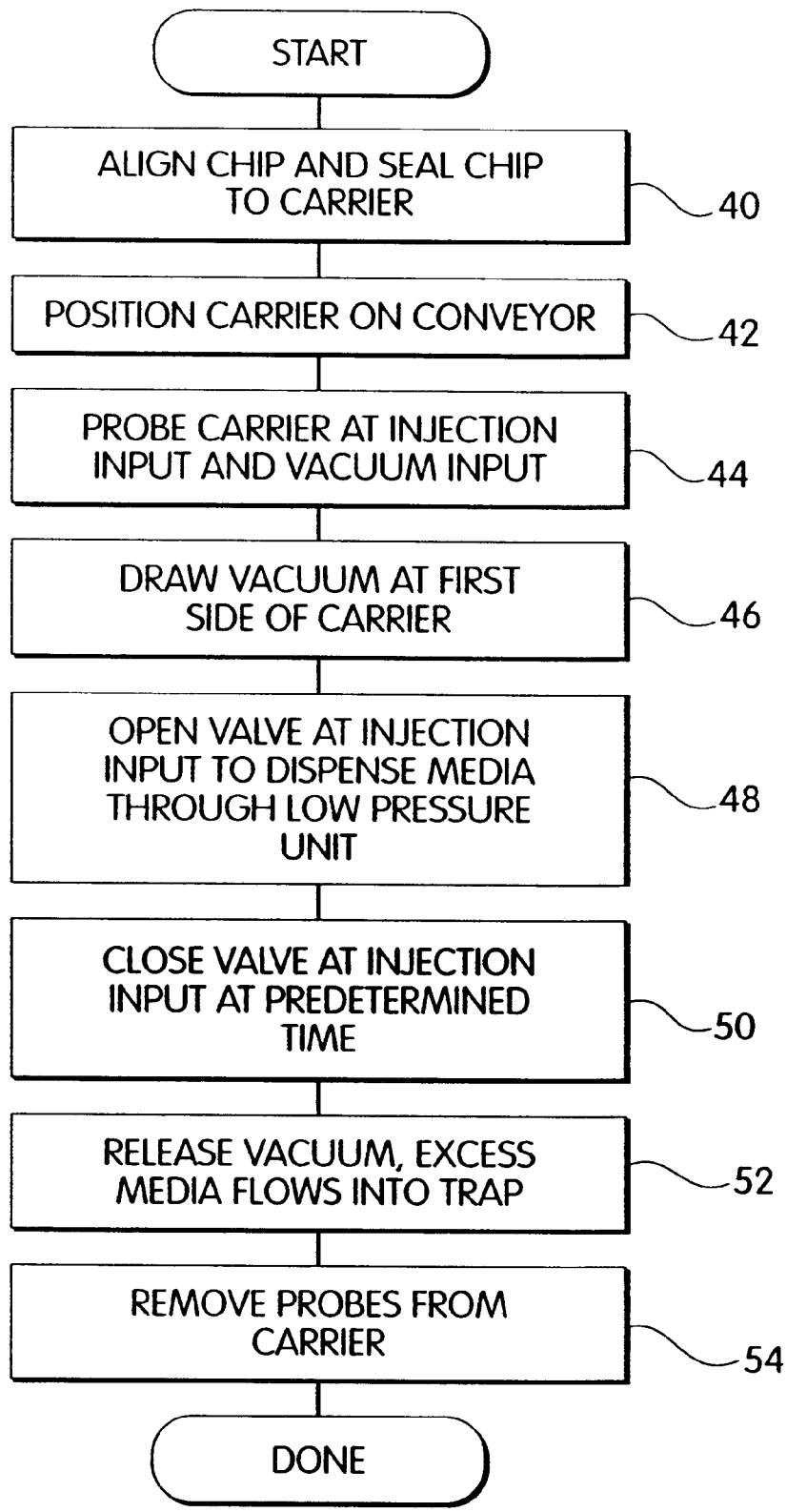
FIG. 3 is flow chart representation of a vacuum injection process, in accordance with one embodiment of the present invention.
Figure 4:
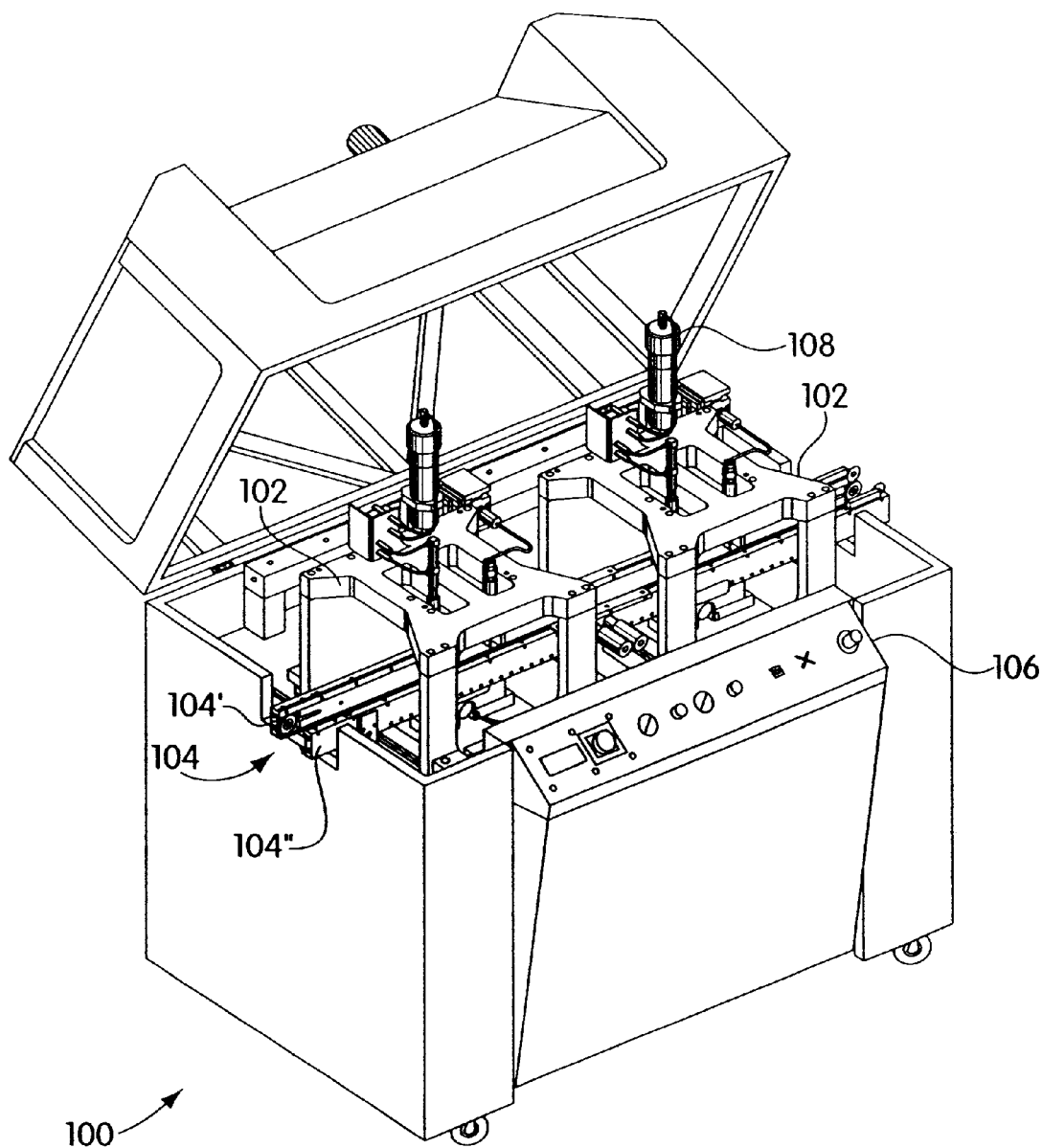
FIG. 4 is a perspective view of a vacuum injection system, in accordance with one embodiment of the invention.

FIG. 3 illustrates a flow chart of a process for encapsulating components using the system of FIG. 1, in accordance with an embodiment of the invention. In a first step of the process, the chip or component 28 is aligned on the workpiece 27 or carrier and is sealed, such as by the top and bottom coverlay tapes 34, 32 of FIG. 2 (step 40). The carrier or workpiece 27 at an injection point in the system 10 is positioned on a conveyor (step 42). The vacuum and encapsulation holes 35, 33 (also referred to as vacuum input and injection input, respectively) are contacted by the vacuum and injection ports (step 44). The vacuum source 14 draws a vacuum at a first side of the workpiece 27 (step 46) to evacuate air from the hollow area 26 containing the components 28 to be encapsulated while simultaneously drawing encapsulant material 24 through the hollow area 26. In one embodiment, prior to step 44 the workpiece 27 may be lifted off of the conveyor to place the vacuum and injection ports 35, 33 in contact with the vacuum nozzle 16 and a nozzle at the injector 18.

After the vacuum source 14 begins applying the vacuum, the injector valve 20 opens to begin dispensing material 24 into the hollow area 26 (step 48). Because the material 24 is at a pressure higher than that in the hollow area 26, the material 24, after being injected from the injector valve 20 is drawn through the hollow area 26, towards the vacuum hole 35. In addition, because the vacuum source 14 is applying a vacuum to the hollow area 26, the material 24 will flow through the hollow area 26 faster than if the hollow area 26 were evacuated then the vacuum was removed. The controller 12 determines how long the vacuum source 14 applies the vacuum and how long the injector 18 can inject material based on a number of factors, which can include the size of the hollow area 26, the number of components 28, the type of material 24, the level of the vacuum being applied, and the amount of material in the trap 22. Those skilled in the art will recognize that other factors may affect the time for encapsulation. Based on information from the controller 12, the injection valve 20 is closed at a predetermined time to stop the injection of material 24 into the hollow area 26 (step 50), and the vacuum is released at a predetermined time. Any excess material 24 that flows out of the vacuum hole 35 flows into the trap 22 and is contained in the trap 22, instead of contaminating the vacuum source 14 (step 52). Then, the injector 18 and vacuum source 14 are be removed from the injection and vacuum holes 33, 35 (step 54), and the next encapsulation step (such as curing of the encapsulant) can proceed.

Note, however, that other events can cause the injection valve 20 (and/or the vacuum valve 16) to stop the encapsulation process from continuing. For example, if a sensor in the trap 22 indicates that the material 24 in the trap 22 reaches a predetermined level, the sensor in the trap 22 can either disable the vacuum source 14, or close the injector valve 20, to stop the vacuum from drawing material 24 through the hollow area 26. It should also be understood that the order of steps 50 and 52 can be reversed; that is, the vacuum can be released before the injection valve 20 is shut.

An embodiment of an automated vacuum encapsulation system 100 in accordance with the present invention will now be described with reference to FIGS. 1 and 4–9. The automated system 100 includes encapsulation assemblies 102, a conveyor 104, and a display and control panel 106. The panel 106 includes various indicators and switches permitting operators to monitor or control at least a portion of the encapsulation process being run at the system 100. For example, if the encapsulation system 100 included a trap 22 (FIG. 1), the panel 106 can include indicators informing an operator the status of the trap 22 (e.g., empty, quarter-full, three quarters full, etc.) or that the trap 22 must be emptied to avoid a shutdown of the system 100.

Also contained within the system 100 are control electronics for the vacuum encapsulation process, such as a controller 12, power circuitry (not shown), air sources (not shown), control pneumatics for the injectors 18 and other devices, cooling fans, and the like. In one embodiment, the control electronics includes a controller 12 having a microprocessor such as a PENTIUM processor, which can be programmed to control the dispensing system, to control the flow of workpieces 27 such as integrated circuits into and out of the dispensing system, and to operate some or all of the other control electronics.

The conveyor 104 of the encapsulation system 100 flows from left to right and is manually adjustable to accommodate parts of varying widths. For example, in this embodiment, the conveyor 104 can be adjusted from 50 mm to 180 mm between its rails 104', 104". A plurality of sensors (not shown) are operable with the conveyor 104 to sense when a workpiece 27 (FIG. 1) has been placed at the entrance end (left side) of the conveyor 104 and to sense when a workpiece 27 has reached an injector assembly 102. The conveyor 104 is made from materials that are safe from electrostatic discharge (ESD).

Figure 5:
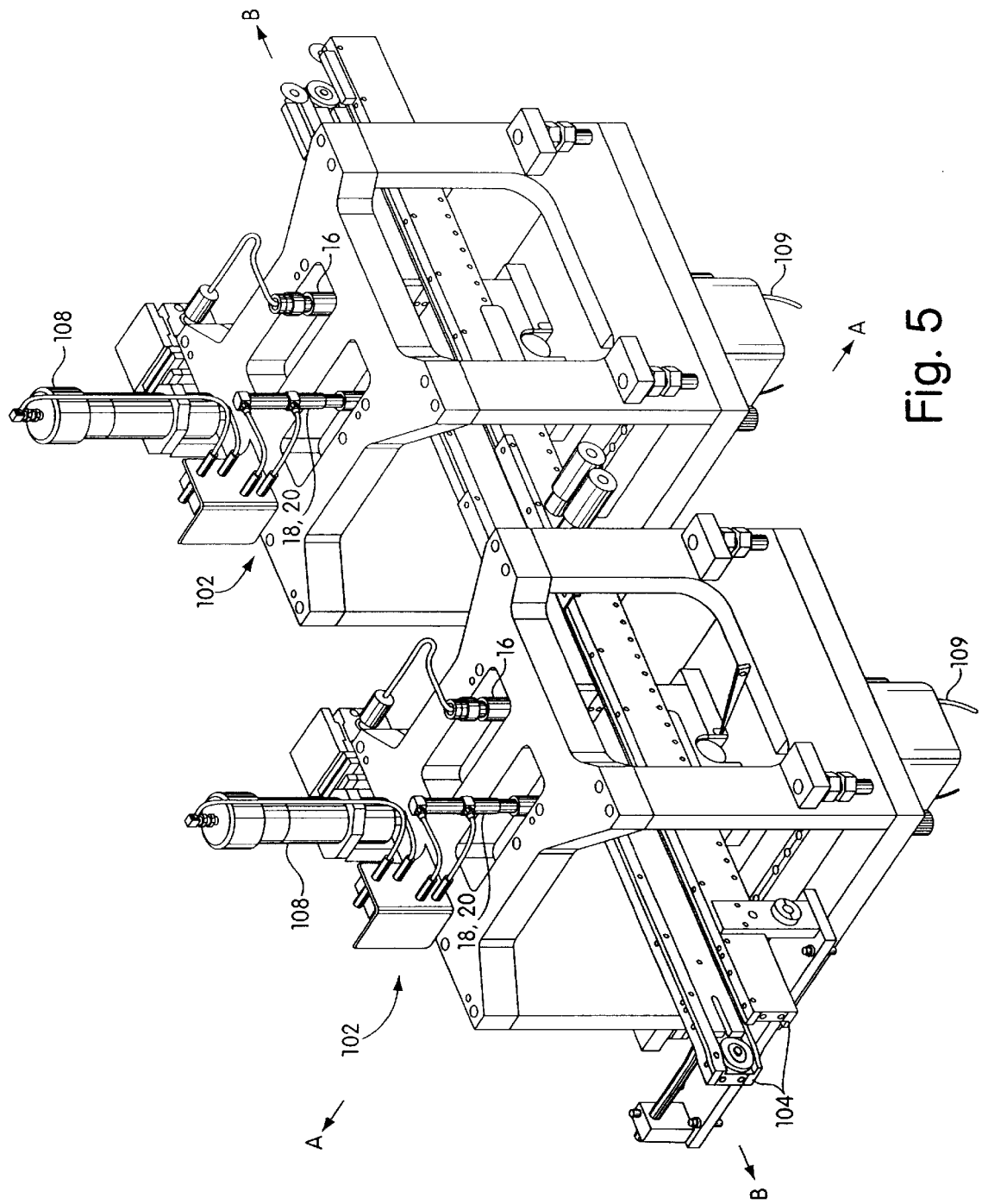
FIG. 5 is a perspective view of the conveyorized portion of the vacuum injection system of FIG. 4.

Referring to FIG. 5, the injector assemblies 102 are illustrated in greater detail. Each injector assembly 102 includes a material assembly 108 dispensing material 24 used for encapsulation. For example, the material assembly 108 accepts 80 cc syringes and 150 cc cartridges as reservoirs for material 24. The locations of the material assemblies 108 ensure that they can be easily accessed and maintained by operators of the system. If the system 100 is running in a continuous high volume environment, however, the materials assembly 108 can be coupled to a bulk material feeding device to avoid frequent replenishment of material 24 while running.

Figure 8:
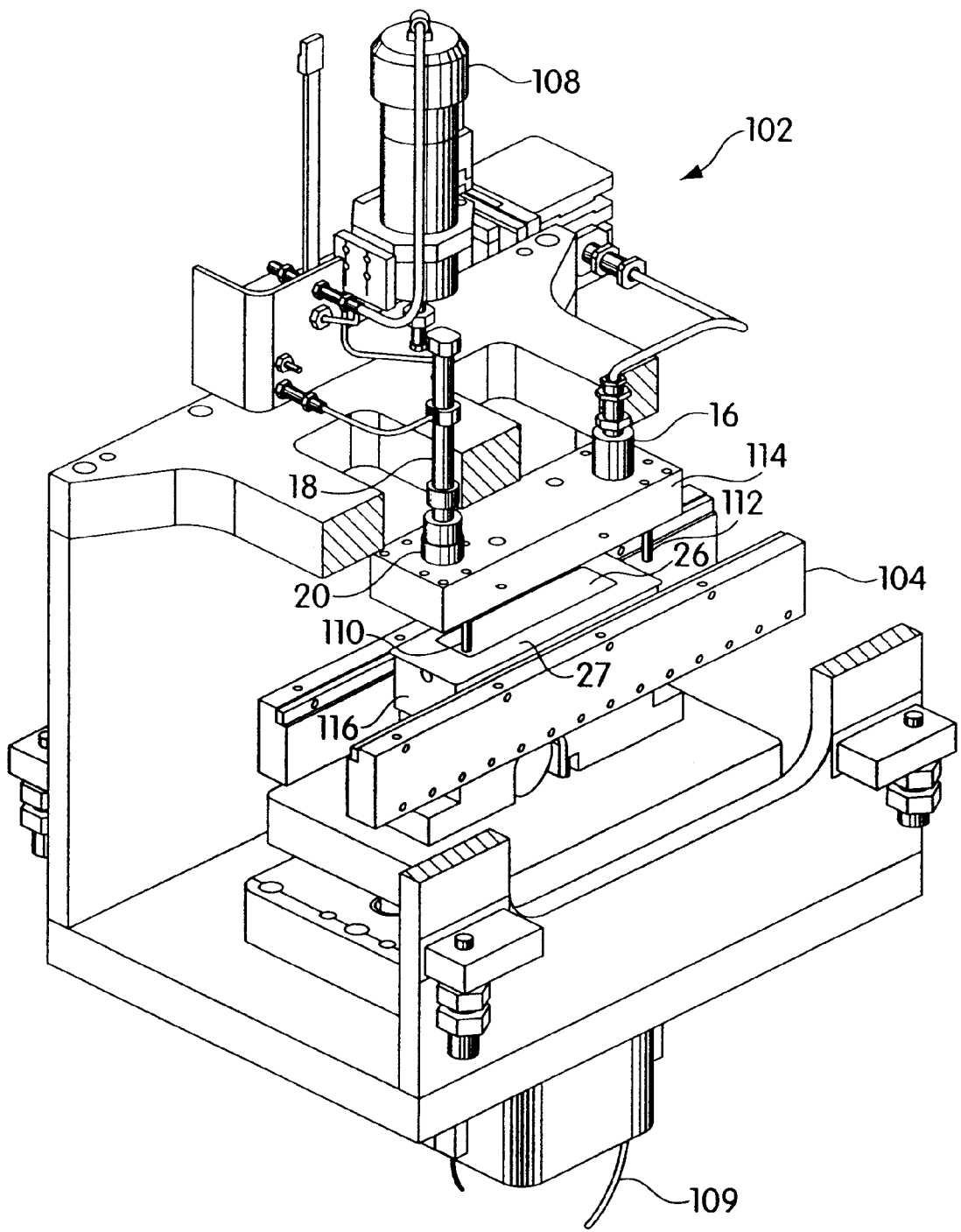
FIG. 8 is another side view of the conveyorized portion of FIG. 5, viewed along the BB axis, illustrating the conveyorized portion in more detail.

As workpieces 27 move along the conveyor 104, when the workpiece 27 reaches the injector assembly 102, a pneumatic assembly 109 helps to lifts the workpiece 27 off of the conveyor 104 and towards the injector assembly 102 (this is shown in greater detail in FIG. 8). When lifted, the workpiece 27 is disposed to contact its injection hole 33 and vacuum hole 35 with a nozzle of the injector valve 20 (not shown in FIG. 5) of the injector 18, and the vacuum nozzle 16 coupled to the vacuum source 14 (not shown in FIG. 5), respectively.

Figure 6:
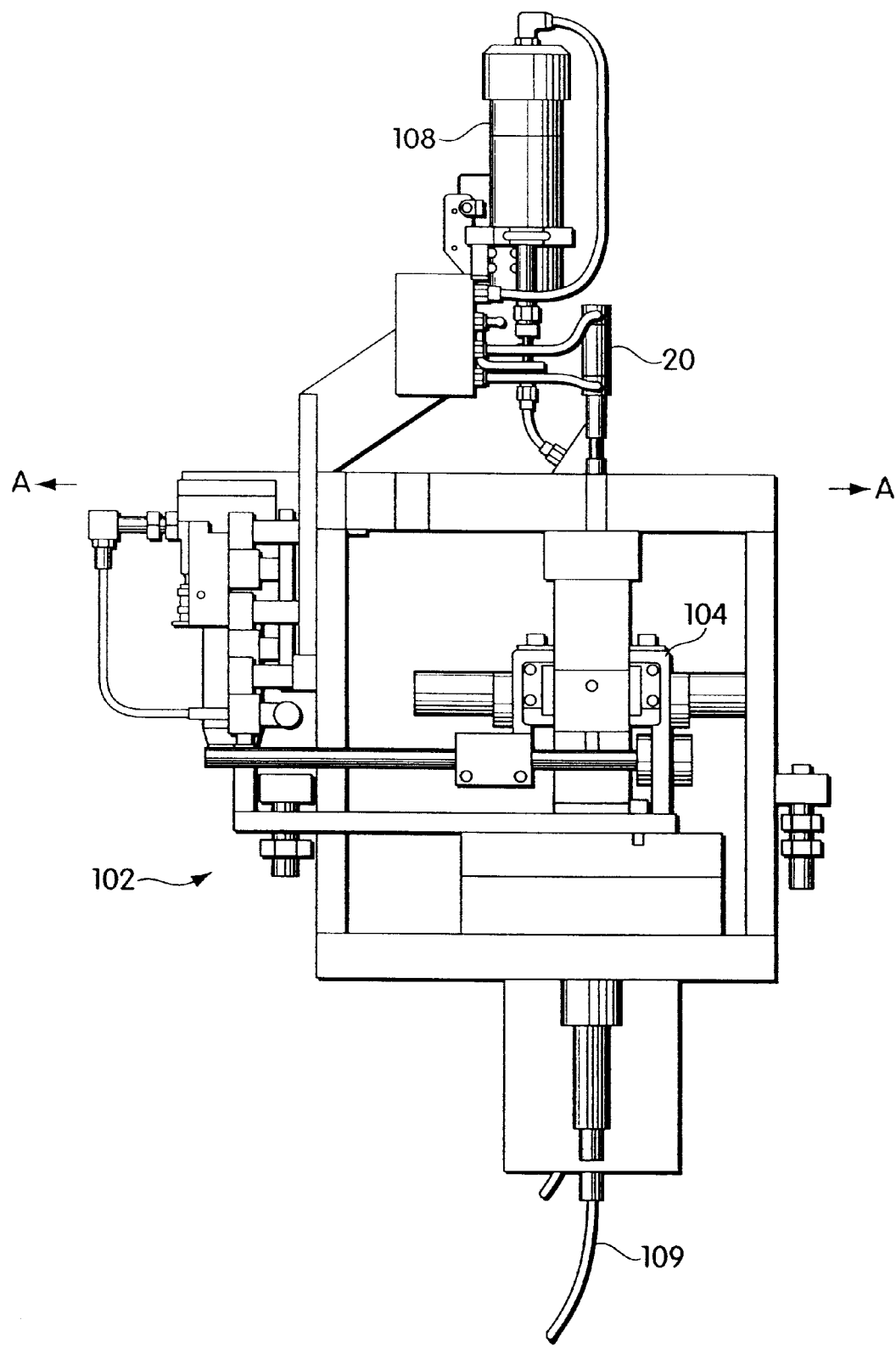
FIG. 6 is a side view of the conveyorized portion of FIG. 5, viewed along the AA axis.

FIG. 6 illustrates a side view of an injector assembly 102 of FIG. 5 taken along the A—A line. This view illustrates the relative physical locations of the injector valve 20 and the pneumatic assembly 109 to the conveyor 104.

Figure 7:
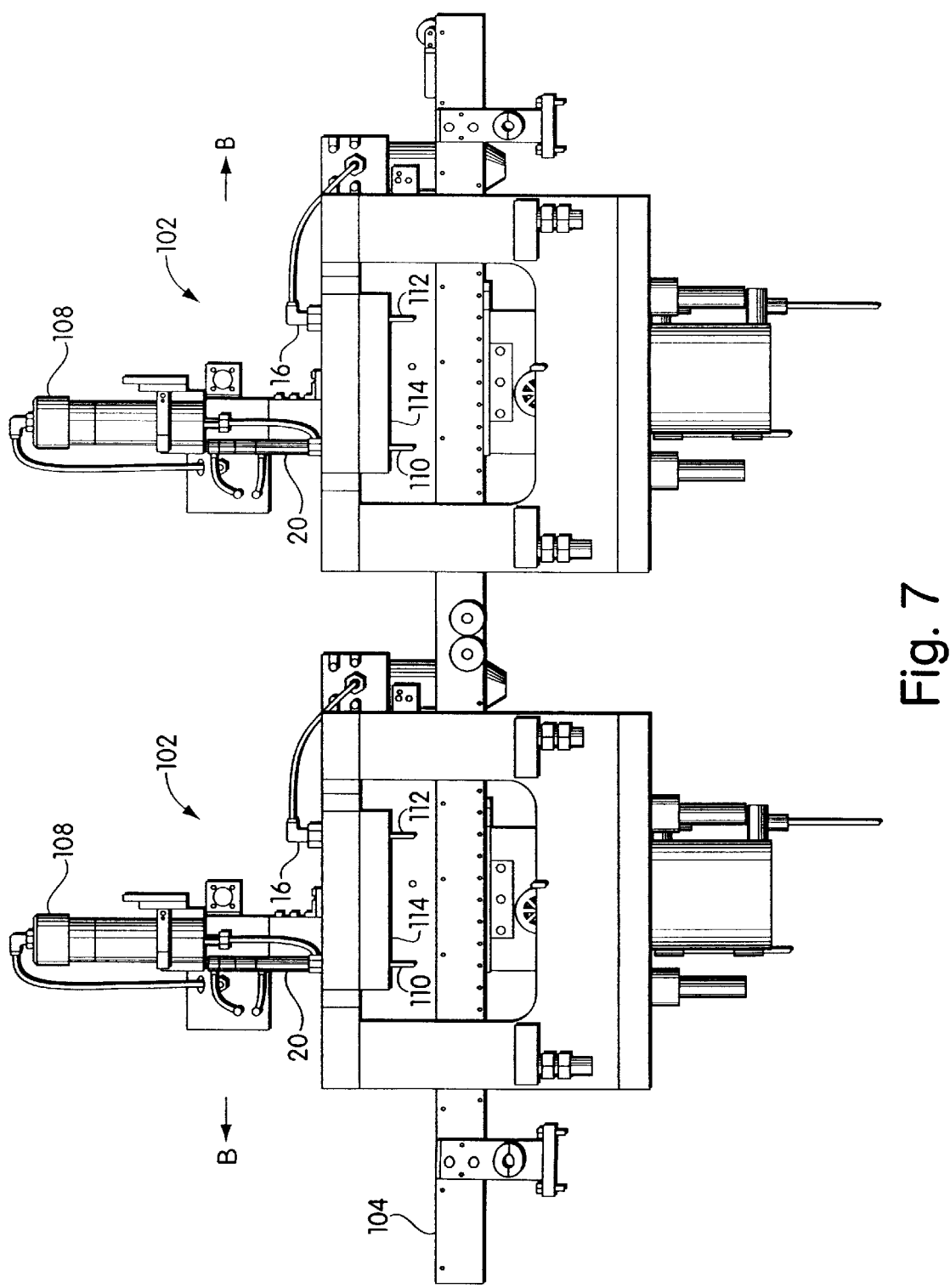
FIG. 7 is a side view of the conveyorized portion of FIG. 5, viewed along the BB axis.

FIG. 7 illustrates another side view of the injector assemblies 102 of FIG. 5 taken along the B—B line. In this view, alignment pins are 110, 112 are shown projecting from a top fixture element 114 in the injector assembly 102. The alignment pins 110, 112 mate with corresponding alignment holes in the workpiece 27, to ensure that the vacuum nozzle 16 and the injector 18 can make proper contact with the injection hole 35 and the vacuum hole 33. Although the alignment holes in the workpiece 27 are not illustrated, those skilled in the art will recognize that conventional alignment pins and alignment holes can be used to align the workpiece 27.

FIG. 8 illustrates still another side view of the injector assemblies 102 of FIG. 5 taken along the B—B line. In this view, the injector nozzle 20 and the vacuum nozzle 16 pass through the top fixture element 114, from which alignment pins 110, 112 project. The workpiece 27 is disposed on a movable bottom fixture element 116, which has been raised a predetermined distance above the conveyor 104, to bring the workpiece 27 towards the injector nozzle 20 and vacuum nozzle 16 at the top fixture element 114. The alignment pins 110, 112 are engageable with corresponding alignment holes in the workpiece 27 and in the bottom fixture element 112, to hold the workpiece 27 and the top and bottom fixture elements 114, 116 at a predetermined alignment.

As the alignment pins 110, 112 are engaged with the workpiece alignment holes and the bottom fixture element alignment holes, the top face of the bottom fixture element 116 is urged towards the bottom face of the top fixture element 114, until the injector nozzle 20 and vacuum nozzle 16 engage the injection hole 33 and vacuum hole 35 of the workpiece 27. Depending on the depth of the alignment holes, the length of the alignment pins 110, 112 and the thickness of the top fixture element 114 where the vacuum nozzle 16 and injector nozzle 20 pass through it, the top fixture element 114 may be in contact with the bottom fixture element 116 when the vacuum nozzle 16 and injector nozzle 20 are in proper engagement with the vacuum hole 35 and injector hole 33.

Although FIGS. 6–8 illustrate that the bottom fixture element 116 has alignment holes and the top fixture element 113 has alignment pins 110, 112, those skilled in the art will recognize that the top fixture element 114 could instead have the alignment holes and the bottom fixture element 116 could have the alignment pins. Similarly, although FIGS. 6–8 illustrate that the bottom fixture element 116 is lifted vertically above the conveyor 104 towards the top fixture element 114, it is possible to instead move the top fixture element 114 towards the bottom fixture element 116, or to move both the top fixture element 114 and the bottom fixture element 116 towards each other. In addition, the fixture element that contacts that contacts the workpiece 27 surface (or the die surface of a component on a carrier) can be adjustable to compensate for variations in the thickness of the workpiece 27 or die thickness. This compensation allows proper clamping and fixturing of the components being processed due to lot variations.

Figure 9A:
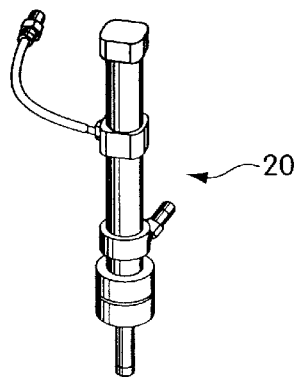
FIGS. 9A–9B are front and exploded views, respectively, of the injection valve of FIGS. 18, in accordance with one embodiment of the invention.
Figure 9B:
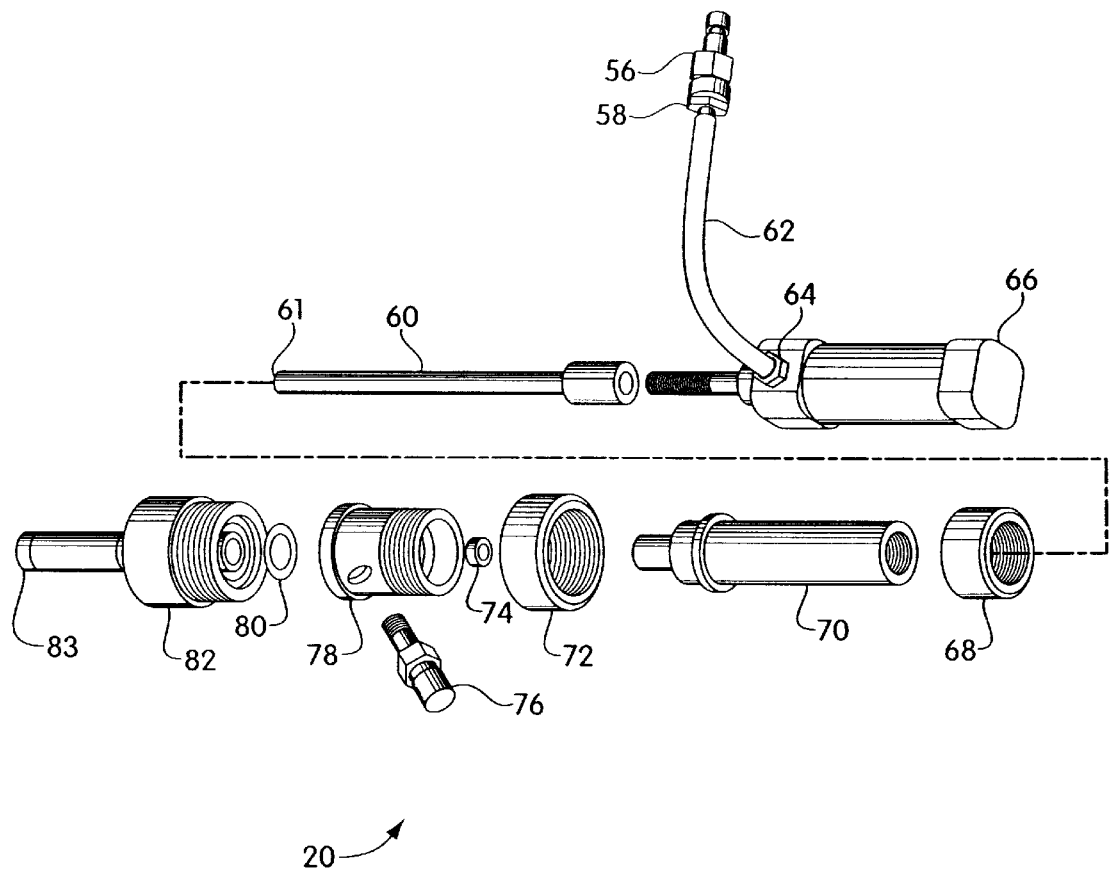

FIGS. 9A–9B illustrate an example of an injector valve 20 usable in accordance with an embodiment of the invention. The injector valve 20 includes a stroke cylinder 66, stopper rod assembly 60, and nozzle assembly 82, along with various fitting and hardware components, which operate together to provide a positive shut-off function that the controller 12 (FIG. 2) can control with precision. Each of these elements is described more fully below.

The nozzle assembly 82 includes a flexible nozzle tip 83 that forms a tight seal to the injection hole 33 of a workpiece 27 (FIGS. 1 and 2). The nozzle tip 83 is "doughnut" shaped and has an opening in the center therein through which material 24 to be injected can flow and which can receive the rod tip 61 of a stopper rod assembly 60 (described more fully below) to block the hole in the nozzle tip 83 and prevent material 24 from escaping. The nozzle assembly 82 is coupled to a first end of an upper body assembly 78 to which a nipple assembly 76 attaches. The nipple assembly 76 couples to a source of material 24, such as the material assembly 108 (FIGS. 4–7), for receiving material to be injected. An 0-ring 80 helps to form a tight seal between the nozzle assembly 82 and the upper body assembly 78.

A piston seal 74 couples the second end of the upper body 78 to a first side of a bushing assembly 70 via a first retainer nut 72. A second retainer nut 68 couples the second side of the bushing assembly 70 to a stroke cylinder 66 and a stopper rod assembly 60. The stroke cylinder 66 is coupled via a length of tubing 62 and first, second, and third fittings 56, 58, 64, to a pressure source 23 (FIG. 2). In one embodiment, the stroke cylinder 66 can be an SMC Cylinder manufactured by Kinequip Inc., Buffalo, N.Y., such as Model. No. NCJ2B16-050T. This model can operate with a maximum pressure of 100 pounds per square inch (PSI), and those skilled in the art will recognize that other stroke cylinders having comparable specifications can be used in accordance with the invention.

The stopper rod assembly 60 is movably coupled to the stroke cylinder 66, such as by spring loading. During operation of the injector valve 20, pressure from a pressure source 23 (FIG. 1) can be applied and removed from the stroke cylinder 66. When pressure is applied, the pressure compresses the spring biasing within the stroke cylinder 66, thereby holding the stopper rod assembly 60 back from the nozzle tip 83. Thus, when pressure is applied, the stopper rod assembly 60 is disposed within the upper body 78 and nozzle assembly 82 to permit material 24 to flow through the nozzle tip 83 of the nozzle assembly 82, through an injection hole 33 (FIG. 1) and into the hollow area 26 of a workpiece 27 (FIG. 1).

When pressure is released, the spring biasing within the stroke cylinder releases and the stroke cylinder 66 can move the stopper rod assembly 60 through the bushing 70 and upper body 78 so that the rod tip 61 of the stopper rod assembly 60 is disposed at the opening in the nozzle tip 83 of the nozzle assembly 82, to prevent material 24 entering through the nipple 76 from escaping through the nozzle tip 83. Because the controller 12 (FIG. 2) can precisely control when and how pressure from pressure source 23 (FIG. 2) is applied, the flow of material 24 out of the injector valve 20 can be precisely controlled.

Figure 10:
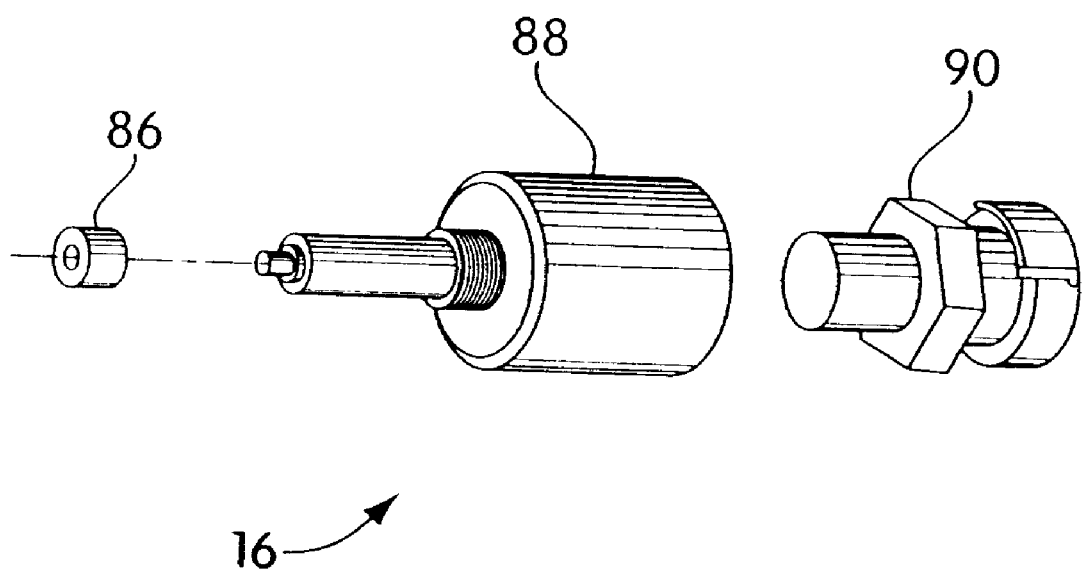
FIG. 10 is an exploded view of the vacuum nozzle FIGS. 1–8, in accordance with one embodiment of the invention.

FIG. 10 illustrates an example of a vacuum nozzle 16 usable in accordance with an embodiment of the invention. A nozzle body 88 has a seal 86 at one end and a fitting 90 at the other end. The fitting 90 and seal 86 are structured and arranged to be operable with the vacuum source 14 (FIG. 1) and to be coupled closely to the vacuum hole 35. Those skilled in the art will recognize the types of vacuum nozzles that may be usable in accordance with the invention.

As described herein, the present invention provides improved systems, methods, and apparatuses for encapsulation of articles such as electronic components. The controller and injector valve precisely control the flow of encapsulant into the workpiece, which ensures that a proper quantity of encapsulant is applied to the articles, improves the yield of the encapsulation process, and decreases waste of encapsulant. Having the controller control operation of the vacuum source provides precise control of the vacuum being applied to the workpiece. This permits the time and magnitude of the applied vacuum to vary based on the encapsulant used and the number and size of articles to be encapsulated.

In addition, use of a vacuum source applying a vacuum directly to the area containing articles to be encapsulated, as described herein, provides advantages over the prior art. First, applying a vacuum only to that area helps to reduce the size of the vacuum source required, thereby reducing the size of the dispensing system overall. Second, applying a vacuum to the area in which encapsulant is being injected at the same time that the encapsulant is being injected speeds the flow of encapsulant through the workpiece and helps ensure that the encapsulant thoroughly contacts all the articles to be encapsulated. In addition, use of a trap in connection with the vacuum source helps prevent encapsulant being drawn through the workpiece from contaminating the vacuum source or other areas outside of the workpiece.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A dispensing system for dispensing material onto a substrate, the dispensing system comprising:
   a controller;
   a vacuum source in electrical communication with the controller, the vacuum source applying a vacuum to at least a portion of the substrate in response to an instruction from the controller;
   an injector in electrical communication with the controller, the injector comprising a valve in communication with a pressure source and a material port in communication with a material source, the valve permitting material from the material source to be dispensed onto a substrate in accordance with an instruction from the controller;

an injecting outlet through which the material source injects material to a process area on the substrate; and an air inlet through which the vacuum source draws air from a process area on the substrate, thereby drawing the injected material through the process area;

wherein the injecting outlet and the air inlet are constructed and arranged to engage respective holes in a layer of cover material disposed adjacent to the process area of the substrate.

2. The system of claim 1 wherein the valve permits material to be dispensed onto a substrate when pressure is applied to the valve and prevents material from the material source from reaching the substrate pressure is removed from the valve.

3. The system of claim 1 further comprising a trap coupled to the air inlet and the vacuum source to receive excess material dispensed onto the substrate.

4. The system of claim 3 wherein the trap further comprises a level sensor detecting the level of excess dispensed material in the trap.

5. The system of claim 4 wherein the level sensor is operably coupled to the controller.

6. The system of claim 5 wherein the controller prevents material from being dispensed onto the substrate when the level sensor detects a predetermined quantity of material in the trap.

7. The system of claim 1 wherein at least one of the injecting outlet and the air inlet are constructed and arranged to mate with a respective hole in the layer of cover material.

8. The system of claim 1 wherein at least one of the injecting outlet and the air inlet are constructed and arranged to project through a respective hole in the layer of cover material.

9. The system of claim 8 wherein at least one of the injecting outlet and the air inlet is constructed and arranged to retract through the layer of cover material when dispensing is complete.

10. The system of claim 1 wherein the injecting outlet and the air inlet are constructed and arranged to align with respective holes that are disposed on opposite sides of the process area.

11. A system for adding encapsulant material beneath a component attached to a substrate, comprising:

means for applying a negative air pressure to at least a portion of a space existing between the component and at least a portion of the substrate;

means for injecting encapsulant material to the space, the injecting means comprising a valve means in communication with a means for applying pressure and an output means in communication with a means for dispensing material, the valve means permitting the material from the dispensing means to be dispensed to the component through the output means; and a controller for controlling the means for applying a negative air pressure and the means for injecting encapsulant material;

wherein the means for applying a negative pressure and the output means are constructed and arranged to engage respective openings in a layer of cover material disposed adjacent to the process area of the substrate.

12. The system of claim 11 further comprising a means for trapping excess material dispensed onto the substrate, the trapping means in communication with the negative air pressure means.

13. The system of claim 12 wherein the trapping means is in operable communication with the controller, wherein the trapping means notifies the controller when the excess material being trapped reaches a predetermined amount.

14. The system of claim 12 wherein the trapping means is in operable communication with the controller, wherein the controller means monitors the amount of material being trapped.

* * * * *